United States Patent
Becklin

(10) Patent No.: US 7,688,584 B1
(45) Date of Patent: Mar. 30, 2010

(54) COOLING SYSTEM FOR RACK-MOUNTED ELECTRONICS EQUIPMENT

(75) Inventor: Dennis M. Becklin, Grants Pass, OR (US)

(73) Assignee: Environmental Container Systems, Inc., Grants Pass, OR (US)

( * ) Notice: Subject to any disclaimer, the term of this patent is extended or adjusted under 35 U.S.C. 154(b) by 0 days.

(21) Appl. No.: 12/244,668

(22) Filed: Oct. 2, 2008

(51) Int. Cl.
H05K 7/20 (2006.01)

(52) U.S. Cl. ............. 361/694; 361/679.46; 361/679.47; 361/679.48; 361/695; 361/697; 165/80.2; 165/80.3; 165/104.33; 165/122; 454/184

(58) Field of Classification Search ............ 361/679.46, 361/679.47, 679.48, 679.49, 679.5, 690–697, 361/699, 717–724, 727, 728, 796; 165/70.2, 165/80.3, 80.4, 80.5, 104.33, 104.34, 121, 165/185; 454/184; 174/50, 15.2, 16.3, 252; 312/223.2, 223.3, 236, 298, 359
See application file for complete search history.

(56) References Cited

U.S. PATENT DOCUMENTS

| | | | | |
|---|---|---|---|---|
| 5,772,500 | A * | 6/1998 | Harvey et al. | 454/184 |
| 5,808,866 | A * | 9/1998 | Porter | 361/695 |
| 6,042,474 | A * | 3/2000 | Harvey et al. | 454/184 |
| 6,411,511 | B1 * | 6/2002 | Chen | 361/697 |
| 6,522,537 | B2 * | 2/2003 | Chen | 361/679.39 |
| 6,728,099 | B1 * | 4/2004 | Tsang et al. | 361/678 |
| 6,985,358 | B2 * | 1/2006 | Thompson et al. | 361/695 |
| 7,042,722 | B2 * | 5/2006 | Suzuki et al. | 361/695 |
| 7,167,380 | B2 * | 1/2007 | Ice | 361/796 |
| 7,210,586 | B2 * | 5/2007 | Ice | 211/26 |
| 7,242,580 | B1 * | 7/2007 | Tanaka | 361/696 |
| 7,248,472 | B2 * | 7/2007 | Vinson et al. | 361/694 |
| 7,319,594 | B2 * | 1/2008 | Nicolai et al. | 361/724 |
| 7,355,852 | B2 * | 4/2008 | Pfahnl | 361/699 |
| 7,408,772 | B2 * | 8/2008 | Grady et al. | 361/679.48 |
| 7,457,112 | B2 * | 11/2008 | Fukuda et al. | 361/679.48 |
| 7,484,552 | B2 * | 2/2009 | Pfahnl | 165/80.4 |
| 7,558,056 | B2 * | 7/2009 | Suzuki et al. | 361/679.49 |
| 7,573,713 | B2 * | 8/2009 | Hoffman et al. | 361/697 |
| 7,609,477 | B2 * | 10/2009 | Atarashi et al. | 360/97.02 |
| 2007/0035923 | A1 * | 2/2007 | Beall et al. | 361/687 |

FOREIGN PATENT DOCUMENTS

KR          570715 B1 *  4/2006

* cited by examiner

Primary Examiner—Michael V Datskovskiy
(74) Attorney, Agent, or Firm—Black Lowe & Graham PLLC

(57) ABSTRACT

A rack-mount case system for receiving, supporting and storing electronics equipment includes a slide-out frame closely received and shock mounted in a case. The system includes a cooling unit having at least one heat sink in fluid communication with a first blower and a manifold in fluid communication with a second blower. A thermoelectric unit is located between the heat sink and the manifold to provide a compact cooling unit that may be secured to a side of the slide-out frame with a bracket, for example.

14 Claims, 3 Drawing Sheets

COOLING SYSTEM FOR RACK-MOUNTED ELECTRONICS EQUIPMENT

BACKGROUND OF THE INVENTION

Various types of transit and rack-mount cases for receiving and supporting electronics equipment have been employed in military and commercial environments since their introduction around 1965. In one aspect, a rack-mount case allows electronics equipment to be slide mounted within a frame or rack, which in turn may be coupled to the case using shock absorbing devices. The entire set of electronics equipment may be removed from the shock mounted rack and installed into racks in military shelters or other systems. The rack-mount case may be fully enclosed, water tight, and sealed from sand, dust and chemical warfare agents.

Preferably, the rack-mount case permits installation of the electronics equipment without modification and takes up a minimum amount of space. In addition, the rack-mount case may be configured to permit operation of the electronics equipment without its removal from the case. As a result of the above features and depending on the environment, the rack-mount case and the electronics equipment inside may be subject to high temperatures during transportation, operation or both.

SUMMARY OF THE INVENTION

A rack-mount case system for receiving, supporting and storing electronics equipment includes a slide-out frame closely received and shock mounted in a case. The system includes a cooling unit having at least one heat sink in fluid communication with a first blower and a manifold in fluid communication with a second blower. A thermoelectric unit is located between the heat sink and the manifold to provide a compact cooling unit that may be secured to a side of the slide-out frame with a bracket, for example.

In one example of the invention, a rack-mount case system includes a case; a frame located within the case and configured to receivably secure electronics equipment; a cooling unit coupled to the frame, the cooling unit having at least one heat sink in fluid communication with a first blower and at least one manifold in fluid communication with a second blower; a thermoelectric component located between the at least one heat sink and the manifold; and a first vent opening located in at least one portion of the case, the first vent opening in fluid communication with the cooling unit, wherein at least the second blower is configured to move air at a desired flow rate within the case.

In another example of the invention, a rack-mount case system includes means for slideably receiving electronics equipment within an interior region of a rack-mount case; means for cooling the interior region by drawing air over a heat sink unit and through a manifold; and means for exchanging air from the interior region with an ambient environment.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

In an example of the present invention, a rack-mount case system includes a frame shock-mounted within a case. The frame may take the form of a slide-out rack located on rails while the case may be made from a fiber-reinforced composite material. The frame is sized to receive electronics equipment such as servers, processors, and other types of electronics equipment. Although the term electronics equipment is used herein, it is appreciated that electronics equipment may include, but is not limited to, electrical, electro-magnetic, electro-optical, optical, computer equipment such as computer networking or computer processing equipment, and electro-mechanical equipment. In addition, the present invention includes a cooling system for maintaining an interior region within the case at a desired temperature or at least within a desired temperature range with respect to a temperature of an ambient environment (i.e., the ambient temperature).

Figure 1:
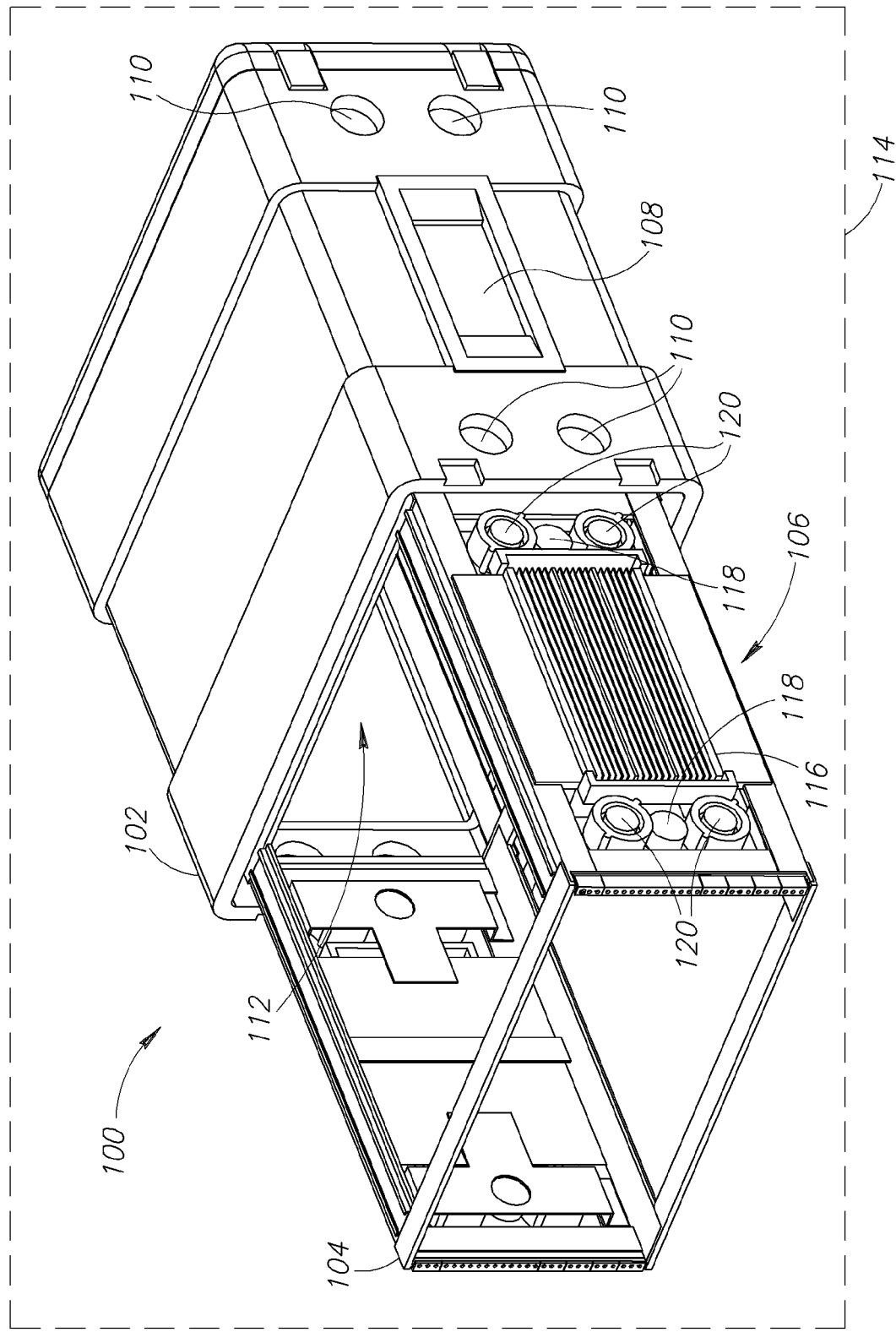
FIG. 1 shows a rack-mount case system having a frame slideably coupled to a case and a heat exchanger unit coupled to the frame according to an embodiment of the present invention.

FIG. 1 shows a rack-mount case system 100 having a case 102 and a frame 104 slideably received by the case 102. The case 102 and the frame 104 may take a variety of forms, such as a system with a slide-out platform in a rack mount case having a slide-out platform configured to secure electronic equipment. The platform is slideably attached to the rack mount case using rails. The first and second rails have a series of indexing holes in order to allow a detent member, such as a dagger pin, to secure the platform in place with respect to the case. The rack mount case may be stackable with other cases and has a front and rear cover. The front and rear covers may be attached to the case to prevent ingress of undesirable water, dust, chemical agents or other debris. In one embodiment, the front and rear covers are attached to the case with seals that are located around a peripheral edge of the case and an engaging region of the front and rear covers. Compression of the seals may be accomplished with one or more latches used to couple the front and rear covers to the case.

The frame 100 may be supported by shock isolating members (not shown) within the case 102. By way of example, the shock isolating members may take the form of visco-elastic or elastomeric members that are deformable, yet able to recover to its original shape after being shock loaded. The shock isolating members are positioned between the case 102 and the frame 104.

Figure 2:
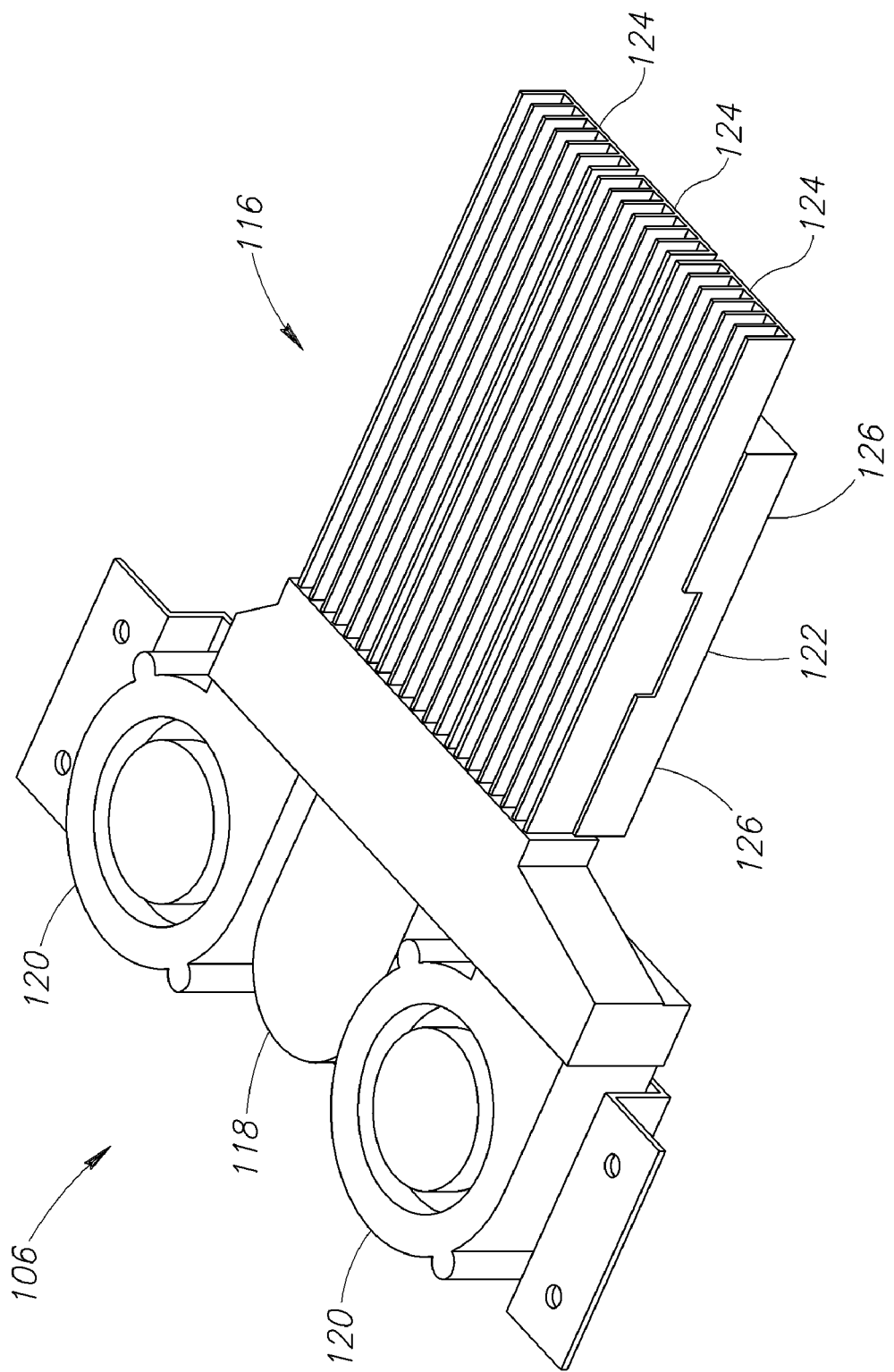
FIG. 2 shows a hot-side of a cooling system having blowers in fluid communication with heat sink units and a manifold according to an embodiment of the present invention.
Figure 3:
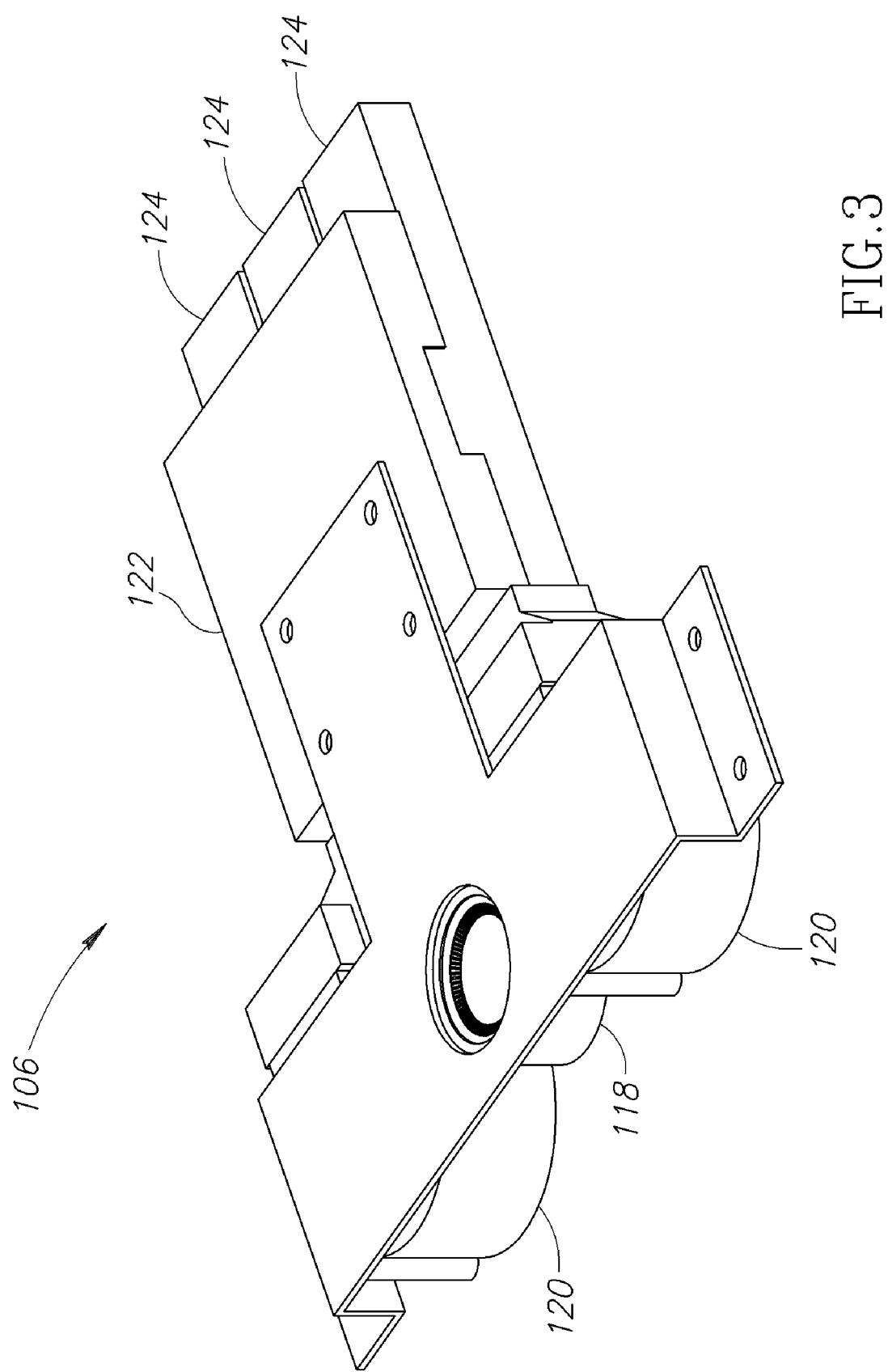
FIG. 3 shows a cold-side of the cooling system of FIG. 2 having blowers in fluid communication with heat sink units and the manifold.

FIGS. 2 and 3 show a cooling system 106 of the rack-mount case system 100 that cooperates with openings 108, 110 (FIG. 1) in the case 102 (FIG. 1) to exchange air between an interior region 112 (FIG. 1) within the case 102 and an ambient environment 114 (FIG. 1) and/or circulate air within the interior region 112. The cooling system 106 includes a heat exchanger unit 116 that is in fluid communication with both the interior region 112 and the ambient environment 114. The heat exchanger unit 116 may take the form of an air cooled heat exchanger. In one embodiment, the cooling system 106 includes one or more cold-side blowers 118 and one or more hot-side blowers 120. The cold-side blower 118 moves air through a cold-side manifold 122 while the hot-side blowers 120 move air over one or more heat sink units 124. One or more thermoelectric components 126 are located between the cold-side manifold 122 and the heat sink units 124. A bracket 128 secures the cooling system 106 to the case 102. The openings 108, 110 (FIG. 1) in the case 102 are configured to substantially align with the cold-side blowers 118 and the hot-side blowers 120, respectively.

During operation, ambient air enters the hot-side blowers 120 and flows over the heat sink units 124, which cools the heat sink units 124 as they draw heat from the thermoelectric components 126. The thermoelectric components 126 generate cold air and remove hot air from the case 102. Accordingly, one side of the cooling system 106 gets hot while the other side gets cold.

Within the case 102, air enters the cold-side blowers 118 and flows through the cold-side manifold 122. The cold-side manifold 122 is chilled by the thermoelectric components 126, which causes chilling of the air flowing through the cold-side manifold 122.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A rack-mount case system comprising:
   a case;
   a frame located within the case and configured to receivably secure electronics equipment;
   a cooling unit coupled to the frame, the cooling unit having at least one heat sink in fluid communication with a first blower and at least one manifold in fluid communication with a second blower;
   a thermoelectric component located between the at least one heat sink and the manifold; and
   a first vent opening located in at least one portion of the case, the first vent opening in fluid communication with the cooling unit,
   wherein at least the second blower is configured to move air at a desired flow rate within the case.

2. The case of claim 1, wherein the second blower is configured to move higher temperature air out of the case.

3. The case of claim 1, wherein the first blower is configured to move ambient air over the at least one heat sink.

4. The case of claim 1, wherein the at least one heat sink unit is arranged in series with another heat sink unit.

5. The case of claim 1, wherein the first vent opening is aligned with the at least one of the blowers of the cooling unit.

6. The case of claim 1, further comprising:
   a second vent opening extending through the case and substantially aligned with the at least one heat sink of the cooling unit.

7. The system of claim 1, wherein the cooling unit operates to reduce a heat load within the case.

8. A rack-mount case system comprising:
   means for slideably receiving electronics equipment within an interior region of a rack-mount case;
   means for cooling the interior region by drawing air over a heat sink unit and through a manifold; and
   means for exchanging air from the interior region with an ambient environment.

9. The case of claim 8, wherein the means for cooling includes a first blower for drawing the air over the heat sink.

10. The case of claim 8, wherein the means for cooling includes a second blower for drawing the air through the manifold.

11. The case of claim 8, wherein the means for cooling includes at least one thermoelectric component.

12. The case of claim 11, wherein the thermoelectric component is located between the heat sink and the manifold.

13. The case of claim 8, wherein the means for exchanging air includes an opening formed in a portion of the case and permitting fluid communication between the interior region and the ambient environment.

14. The case of claim 8, wherein the means for cooling substantially reduces a heat load within the interior region of the case.

* * * * *